(12) United States Patent
Ugale et al.

(10) Patent No.: US 11,438,010 B2
(45) Date of Patent: Sep. 6, 2022

(54) SYSTEM AND METHOD FOR INCREASING LOGICAL SPACE FOR NATIVE BACKUP APPLIANCE

(71) Applicant: EMC IP Holding Company LLC, Hopkinton, MA (US)

(72) Inventors: Rahul Ugale, Santa Clara, CA (US); Colin Zou, San Jose, CA (US)

(73) Assignee: EMC IP HOLDING COMPANY LLC, Hopkinton, MA (US)

( * ) Notice: Subject to any disclaimer, the term of this patent is extended or adjusted under 35 U.S.C. 154(b) by 387 days.

(21) Appl. No.: 16/653,102

(22) Filed: Oct. 15, 2019

(65) Prior Publication Data

US 2021/0111735 A1 Apr. 15, 2021

(51) Int. Cl.
| | | |
|---|---|---|
| G06F 16/00 | (2019.01) | |
| H03M 7/30 | (2006.01) | |
| G06F 9/54 | (2006.01) | |
| G06F 16/174 | (2019.01) | |
| G06F 9/50 | (2006.01) | |

(52) U.S. Cl.
CPC ........ *H03M 7/3091* (2013.01); *G06F 9/5027* (2013.01); *G06F 9/542* (2013.01); *G06F 16/1744* (2019.01); *G06F 16/1748* (2019.01); *H03M 7/3064* (2013.01)

(58) Field of Classification Search
CPC ............. G06F 16/1744; G06F 16/1748; G06F 9/5027; G06F 9/542; H03M 7/3064
USPC ......................................................... 707/693
See application file for complete search history.

(56) References Cited

U.S. PATENT DOCUMENTS

| | | | | |
|---|---|---|---|---|
| 8,117,464 | B1* | 2/2012 | Kogelnik | ............ G06F 16/1748 726/30 |
| 9,195,672 | B1* | 11/2015 | Pang | ................... G06F 16/2365 |
| 2010/0274772 | A1* | 10/2010 | Samuels | ............... G06F 16/188 707/693 |
| 2011/0113115 | A1* | 5/2011 | Chang | ................. G06F 15/7803 709/213 |

* cited by examiner

*Primary Examiner* — Vincent F Boccio
(74) *Attorney, Agent, or Firm* — Womble Bond Dickinson (US) LLP

(57) ABSTRACT

One embodiment provides a computer implemented method of data compression including segmenting user data into data segments; deduplicating the data segments to form deduped data segments; compressing the deduped data segments into compression units using a hardware accelerator; packing the compression units into compression regions; and packing the compression regions into one or more containers.

20 Claims, 7 Drawing Sheets

SYSTEM AND METHOD FOR INCREASING LOGICAL SPACE FOR NATIVE BACKUP APPLIANCE

FIELD OF THE INVENTION

Embodiments of the present invention relate generally to data compression and systems. More particularly, embodiments of the invention increase performance and support compatibility of data compression with a hardware accelerator.

BACKGROUND

Notable portions of central processing unit (CPU) bandwidth are consumed by compression and decompression in storage systems. In many usage scenarios, such as backup, restore, and replication, system performance is bottlenecked by CPU bandwidth. In some scenarios, performance can be improved using a hardware accelerator.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Figure 1:
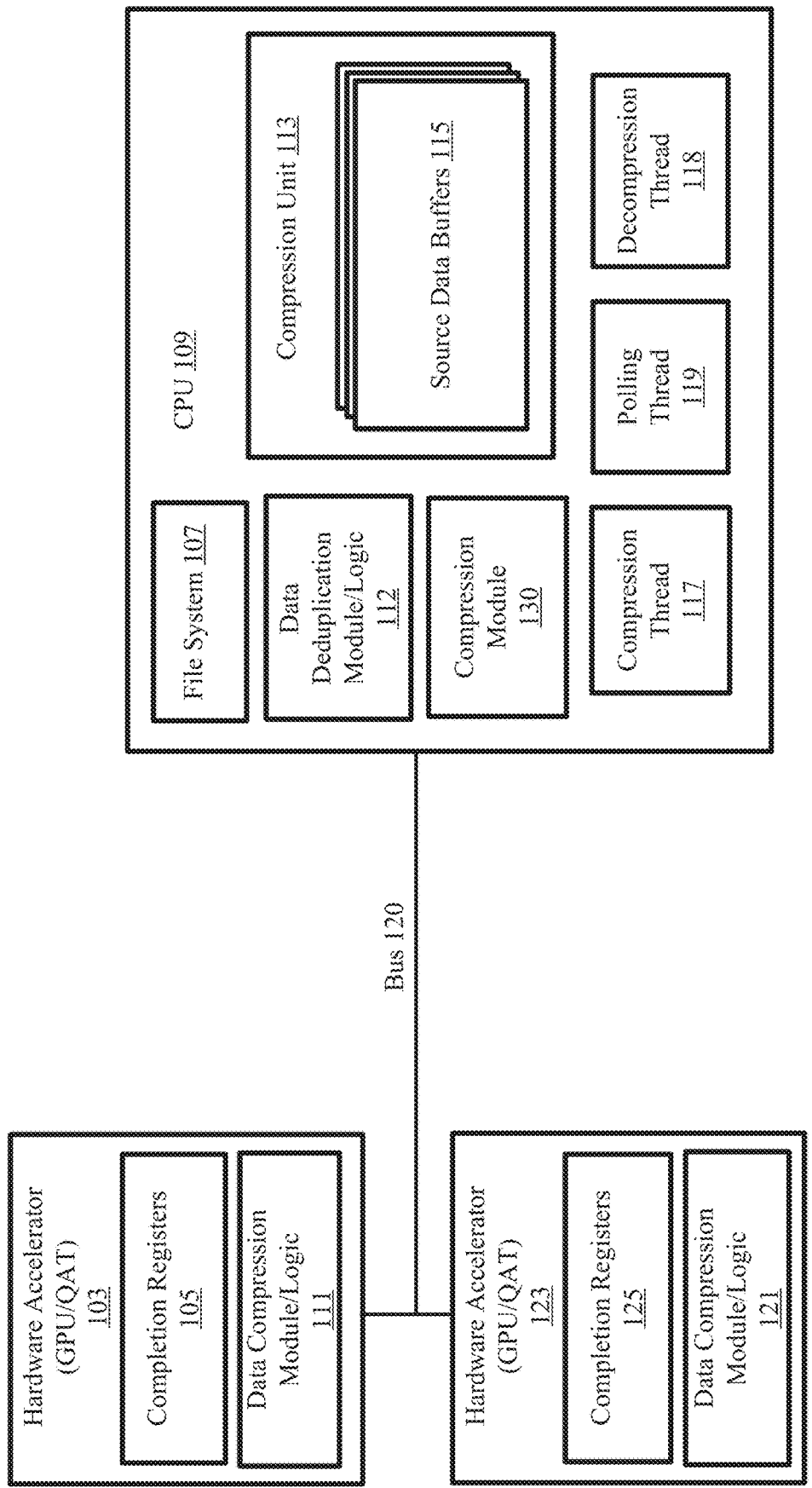
FIG. 1 is a block diagram illustrating a data compression system, according to an embodiment.

Embodiment described herein provide for a computer implemented method of data compression. The method includes segmenting user data into data segments; deduplicating the data segments to form deduped data segments; compressing the deduped data segments into compression units using a hardware accelerator; packing the compression units into compression regions; and packing the compression regions into one or more containers. In some embodiments, the hardware accelerator is a QuickAssist Technology accelerator. In some embodiments, the compression regions are stored in a non-volatile memory. In some embodiments, the method also includes: transmitting a notification to a file system indicating that the compression has been completed. In some embodiments, the method also includes: reading locally compressed data into a file system; decompressing the locally compressed data to recover data segments and reconstruct a file; performing deduplication on the file by sending fingerprints to a cloud to form deduped data; compressing the deduped data using a hardware accelerator to form compressed data; and sending the compressed data to the cloud. In some embodiments, the hardware accelerator is a QuickAssist Technology accelerator. In some embodiments, the compressed data includes content data and metadata.

Another aspect of the present disclosure includes a data compression system. The data compression system includes one or more processing devices; a hardware accelerator for compressing and decompressing data; and data compression logic to compress data via the one or more processing devices. The data compression logic is configured to: segment user data into data segments; deduplicate the data segments to form deduped data segments; compress the deduped data segments into compression units using a hardware accelerator; pack the compression units into compression regions; and pack the compression regions into one or more containers. In some embodiments, the hardware accelerator is a QuickAssist Technology accelerator. In some embodiments, the compression regions are stored in a non-volatile memory. In some embodiments, the compression logic is also configured to transmit a notification to a file system indicating that the compression has been completed. In some embodiments, the compression logic is also configured to: read locally compressed data into a file system; decompress the locally compressed data to recover data segments and reconstruct a file; perform deduplication on the file by sending fingerprints to a cloud to form deduped data; compress the deduped data using a hardware accelerator to form compressed data; and send the compressed data to the cloud.

Another aspect of the present disclosure includes a non-transitory computer-readable medium storing instructions which, when executed by one or more processors, cause the one or more processors to perform a data compression operation. The data compression operation includes: segmenting user data into data segments; deduplicating the data segments to form deduped data segments; compressing the deduped data segments into compression units using a hardware accelerator; packing the compression units into compression regions; and packing the compression regions into one or more containers. In some embodiments, the hardware accelerator is a QuickAssist Technology accelerator. In some embodiments, the compression regions are stored in a non-volatile memory. In some embodiments, the operation also includes transmitting a notification to a file system indicating that the compression has been completed. In some embodiments, the operation also includes: reading locally compressed data into a file system; decompressing the locally compressed data to recover data segments and reconstruct a file; performing deduplication on the file by sending fingerprints to a cloud to form deduped data; compressing the deduped data using a hardware accelerator to form compressed data; and sending the compressed data to the cloud. In some embodiments, the compressed data includes content data and metadata.

Data compression algorithms can include LZ and GZ compression algorithms. Typically, GZ compression would have higher compression rates than LZ compression, but GZ compression can utilize more resources, such as CPU cycles. As a result, a CPU would not be able to efficiently perform GZ compression. In some embodiments, data compression can be offloaded to a hardware accelerator, such as a QuickAssist Technology (QAT) compatible accelerator or a general-purpose processing unit (GPU). With QAT/GZ compression, higher compression rates can be achieved, which in turn increases the logical storage space of a storage system. Logical storage space refers to the increased storage space due to data compression, in which a fixed physical storage space can store more data (e.g., compressed data).

High CPU utilization can slow down overall performance and prevent adopting algorithms with high compression ratios. For example, a system may support LZ by default in order to achieve performance instead of using GZ, even though GZ in general may have a better compression ratio than LZ (as much as 30% better).

If a hardware accelerator is supported in storage systems without compatibility support and performance optimizations, it may not be possible in to update a storage controller and continue working on existing data on disk enclosures. It also may not be possible to continue using a software compressor, and there may be no backup for the hardware accelerator in case of device failure. Furthermore, it may not be possible to achieve optimized performance due to latency and threads context switch overheads.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

In the description of the embodiments provided herein, the terms "coupled" and "connected," along with their derivatives, may be used. It should be understood that these terms are not intended as synonyms for each other. "Coupled" is used to indicate that two or more elements, which may or may not be in direct physical or electrical contact with each other, co-operate or interact with each other. "Connected" is used to indicate the establishment of communication between two or more elements that are coupled with each other. Additionally, the terms "server," "client," and "device" are intended to refer generally to data processing systems rather than specifically to a particular form factor for the server, client, and/or device.

System Overview

FIG. 1 is a block diagram illustrating a data compression system 100 in accordance with one of the embodiments described herein. The storage system 100 includes a CPU 109 and one or more hardware accelerators 103, 123 in communication with the CPU 109 over a bus or interconnect 120, which may be a peripheral component interconnect express (PCIe) link. The storage system 100 may further other components such as memory, storage devices, network interface, etc. Although only two data processing (DP) accelerators 103 and 123 are shown, more DP accelerators may also be coupled to the host processor, i.e., CPU 109. Similarly, although only one CPU shown, more CPUs may be implemented as a multi-processor or multi-core processing system. For example, file system 107 and compression module 130 may be loaded into memory (e.g., random access memory) and executed by CPU 109. System 100 may represent a primary storage system or a backup storage system that receives backup data from the primary system.

System 100 may be a deduplicated storage system that deduplicates the data and stored only the non-duplicated data segments in the persistent storage devices such as hard disks. The data may be compressed into one or more compression regions (CRs) and the compression regions may be stored in one or more containers.

In one embodiment, the hardware accelerator 103, 123 is a GPU, or a QuickAssist Technology (QAT) accelerator provided by Intel, and the hardware accelerator includes a data compression module 111, 121 that can perform the compression and/or decompression processes described herein. A QAT accelerator is a hardware accelerator for cryptographic and compression algorithms. QAT technology accelerates and compresses cryptographic workloads by offloading the data to hardware capable of optimizing those functions. This makes it easier for developers to integrate built-in cryptographic accelerators into network and security applications.

The CPU 109 also includes a data deduplication module 112, which can perform deduplication on data segments. The deduplication can be performed, for example, as disclosed in U.S. patent application Ser. No. 15/190,448, which is herein incorporated by reference in its entirety. In one example embodiment, compression using a hardware accelerator, such as a QAT hardware accelerator, can provide up to 2.6× compression instead of 2× compression. Combined with deduplication (which can provide up to 10× compression), one can achieve up to 26× compression.

In one embodiment, the data compression module 130 (also referred to as a host compression module) can allocate a thread pool for compression jobs and a polling thread 119 for polling the status of the hardware accelerator 103. The data compression module 111 can also retrieve a compression thread 117 from the thread pool in response to a compression request from the file system 107, and likewise retrieve a decompression thread 118 in response to a decompression request. In one embodiment, the data compression module 130 aggregates multiple source data buffers 115 from the file system into a compression unit 113 and submits a scatter gather list and a destination buffer to a hardware accelerator such as the hardware accelerator 103. In another embodiment, the polling thread 119 can periodically poll completion registers 105, 125 of the hardware accelerator to determine whether the compression and/or decompression tasks have been completed by the hardware accelerators. The data deduplication module 112 can also perform one or more of the processes disclosed below in FIGS. 2-3.

The system 100 may include any type of server or cluster of servers. For example, the system 100 may be a storage server used for at least one of a variety of different purposes—for example, to provide multiple users with access to shared data and/or to back up mission critical data. The system 100 may be, for example, a file server (e.g., an appliance used to provide NAS capability), a block-based storage server (e.g., used to provide SAN capability), a unified storage device (e.g., one which combines NAS and SAN capabilities), a nearline storage device, a direct attached storage (DAS) device, a tape backup device, or essentially any other type of data storage device. The system 100 may have a distributed architecture, or all of its components may be integrated into a single unit. The file system may be implemented as part of an archive and/or backup storage system such as a deduplication storage system available from EMC® Corporation of Hopkinton, Mass. In deduplicated storage systems, multiple stored files or objects may contain and thus reference the same stored chunk of data. A chunk of data within a deduplication storage system may be referred to as a data segment. Fingerprints and other metadata are generated and maintained for stored segments of data and the segment of data is stored only once. The metadata associated with the segments are used to link the stored segments with files or objects.

Note that some or all of the components as shown and described may be implemented in software, hardware, or a combination thereof. For example, such components can be implemented as software installed and stored in a persistent storage device, which can be loaded and executed in a memory by one or more processors that, in response to instructions within the software, are configured to carry out the processes or operations described throughout this application. Alternatively, such components can be implemented as executable code programmed or embedded into dedicated hardware such as an integrated circuit (e.g., an application specific IC or ASIC), a digital signal processor (DSP), or a field programmable gate array (FPGA), which can be accessed via a corresponding driver and/or operating system from an application. Furthermore, such components can be implemented as specific hardware logic in a processor or processor core as part of an instruction set accessible by a software component via one or more specific instructions.

While the present disclosure mentions particular types of hardware systems, both CPU systems and hardware accelerators, the techniques disclosed herein are not limited to any particular type of processing system or hardware accelerator.

Figure 2:
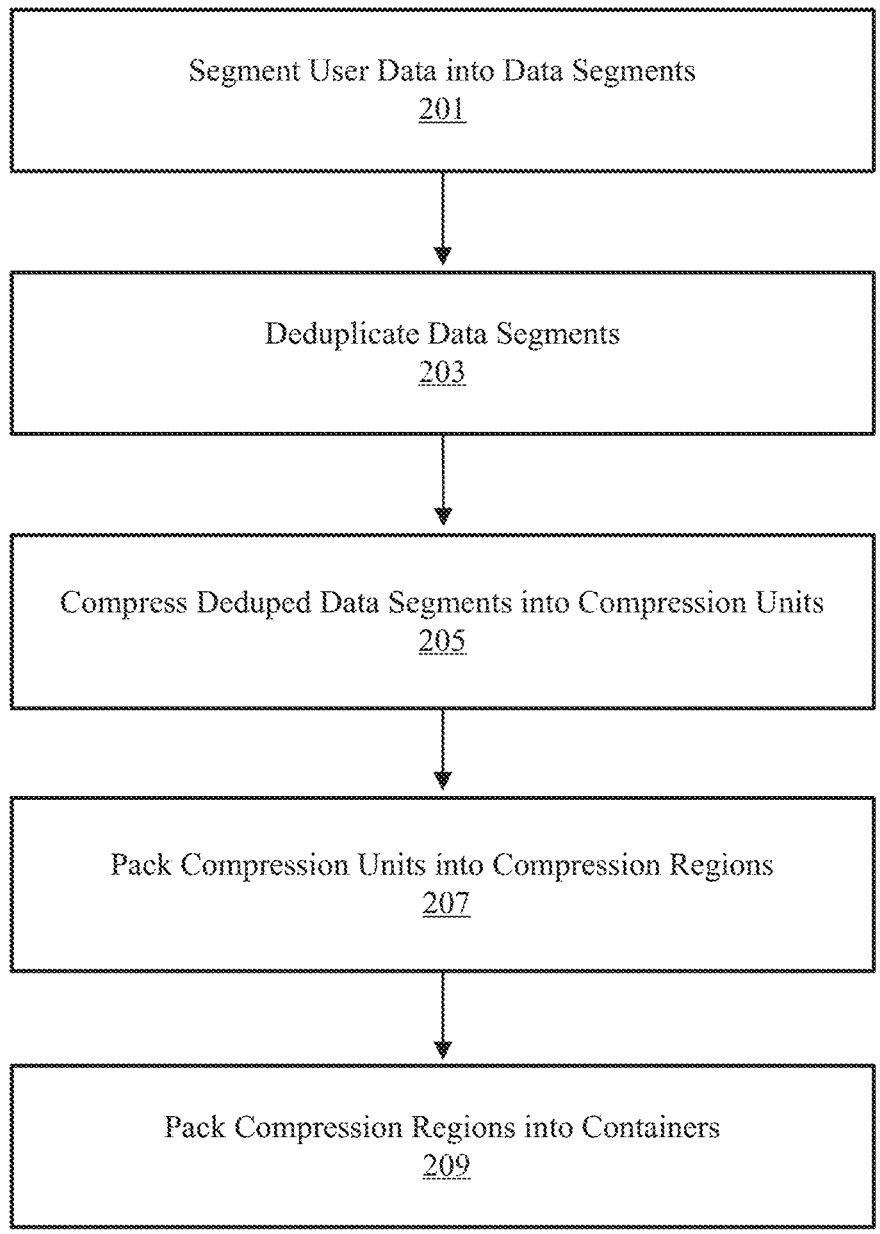
FIG. 2 is a flow diagram of an example data compression process, according to an embodiment.

FIG. 2 is a flow diagram of an example data compression process 200, according to an embodiment of the present disclosure. One or more operations of the data compression process 200 can be executed, for example, by the data compression module 111 and/or data deduplication module 112 in FIG. 1.

In operation 201, user data is segmented into data segments.

In operation 205, the data segments are deduplicated to form deduped data segments. As discussed above, the deduplication can be performed according to the techniques disclosed in U.S. patent application Ser. No. 15/190,448, which is incorporated by reference in this application.

In operation 205, the deduped data segments are compressed into compression units using GZ compression algorithm performed by the hardware accelerator, such as a QAT hardware accelerator.

In operation 207, the compression units are packed into compression regions. In alternative embodiments, the compression regions are stored in a non-volatile memory and a notification is sent to the file system indicating that the compression has been completed.

In operation 209, the compression regions are packed into one or more containers, and then may be stored in a disk. In some embodiments, due to the GZ/QAT, instead of LZ/CPU, the compression rate would be higher in a deduplication storage system.

Figure 3:
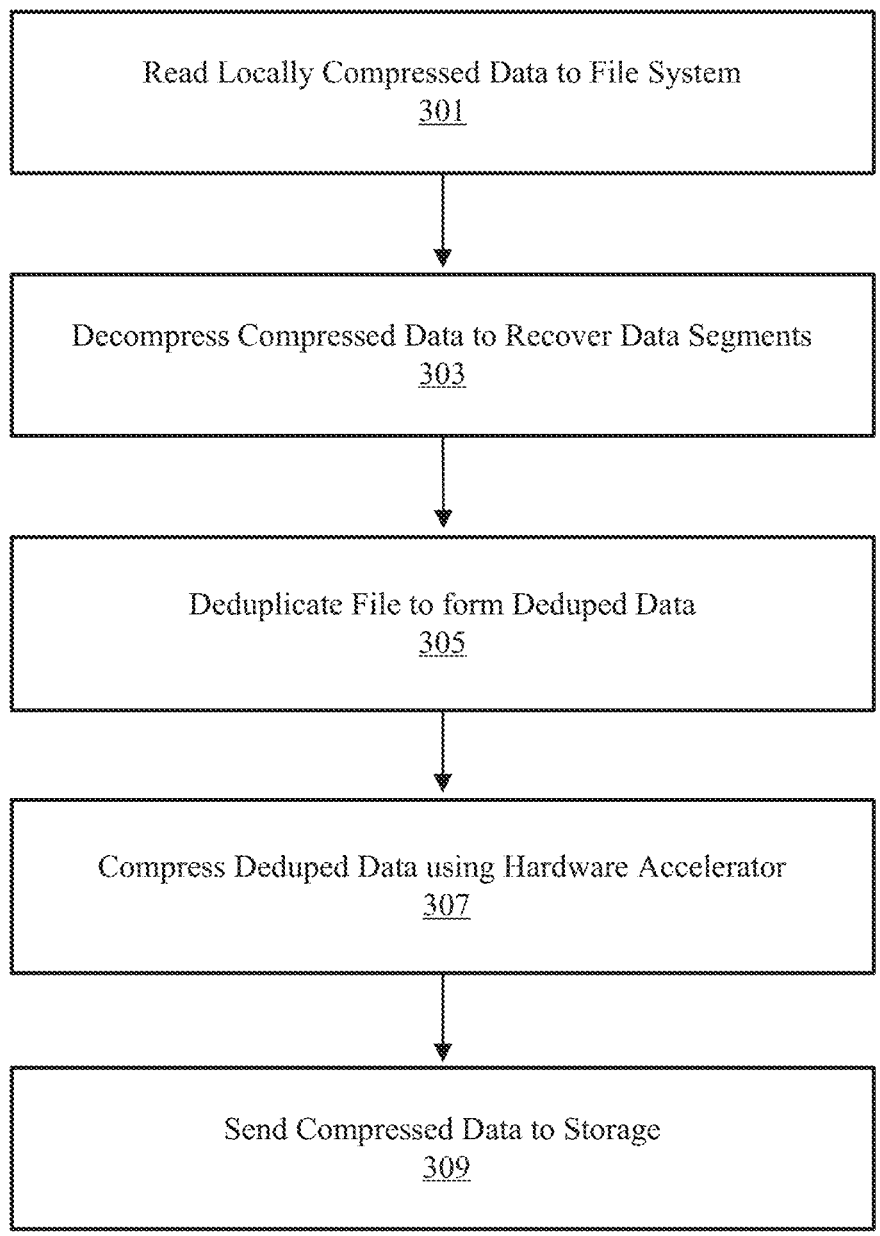
FIG. 3 is a flow diagram of another example data compression process, according to an embodiment.

FIG. 3 is a flow diagram of an example data compression process 300, according to an embodiment of the present disclosure. One or more operations of the data compression process 300 can be executed, for example, by the data compression module 111 and/or data deduplication module 112 in FIG. 1. In one embodiment, GZ/QAT technology can also be applied to a cloud storage system. Due to higher compression rates, network bandwidth requirements or latency can be lowered and the logical storage space can be increased in the cloud storage system. The accessing time and storage space of a cloud storage system is directly related to the cost of the cloud services.

In operation 301, locally compressed data is read from a disk into file storage. In one embodiment, the file storage can be, for example, a 4.5 MB container.

In operation 303, the compressed data is decompressed to recover the data segments and reconstruct the file.

In operation 305, deduplication is performed on the file by sending fingerprints to the cloud to determine if the segments have already been stored there, and only the deduplicated segments are sent to the cloud. As discussed above, the deduplication can be performed according to the techniques disclosed in U.S. patent application Ser. No. 15/190, 448, which is incorporated by reference in this application.

In operation 307, the deduplacated data is compressed using GZ/QAT. In one embodiment, the compressed data includes the content data and metadata.

In operation 309, the compressed data is sent to the cloud.

Figure 4:
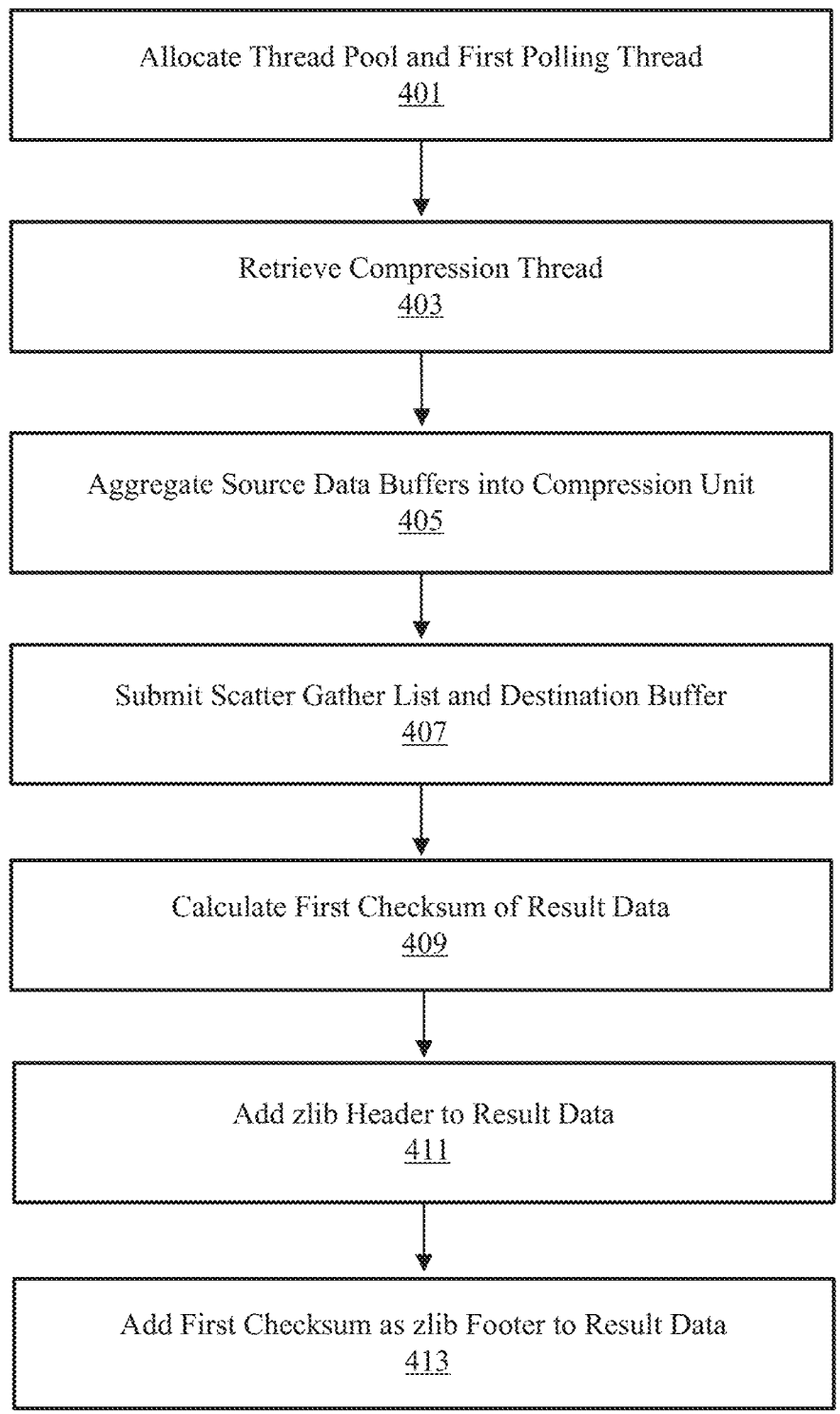
FIG. 4 is a flow diagram of an example data compression process, according to an embodiment.

FIG. 4 is a flow diagram of an example data compression process 400, according to an embodiment of the present disclosure. The data compression process 400 can be executed, for example, by the data compression module 130 in FIG. 1.

In operation 401, the data compression module can allocate a thread pool for compression jobs and a first polling thread for polling the status of the hardware accelerator. In one embodiment, the hardware accelerator includes a QAT-GZ hardware compressor, and the polling thread polls the complete status of the QAT-GZ compressor when the system initializes.

In operation 403, the data compression module retrieves a compression thread from a thread pool in response to a compression request from the file system. In one embodiment, the compression thread handles the request and source data buffer.

In operation 405, instead of performing compression for each incoming request and data buffers, the data compression module aggregates multiple source data buffers from the file system into a single compression unit. In one embodiment, the source data buffers are aggregated into the compression unit until the compression unit size grows to a preset value. In one example embodiment, the compression unit is allowed to grow to 128 KB. As discussed above, the source data buffers in the compression unit are linked into a scatter gather list.

In operation 407, the data compression module submits the scatter gather list to the QAT-GZ compressor of a hardware accelerator by a synchronous call, and also submits a destination buffer for getting compressed data. In one embodiment, the scatter gather list and the destination buffer are submitted simultaneously. In another embodiment, the compression thread is blocked after submission of the scatter gather list and the destination buffer. In some embodiments, the polling thread periodically polls the completion registers of the hardware accelerator and wakes up the compression thread.

In operation 409, the compression thread gets the result data from the destination buffer, and a first checksum of the result data is calculated and returned by the hardware accelerator.

In operation 411, the compression thread adds the zlib header (fixed bytes) to the head of the result data. In some embodiments, there are reserved fixed length rooms at the head of the destination buffer in operation 407.

In operation 413, the compression thread appends the first checksum from operation 409 to the result data as the zlib footer. The compression thread can then pass the destination buffer to the file system, and can return to the thread pool.

Figure 5:
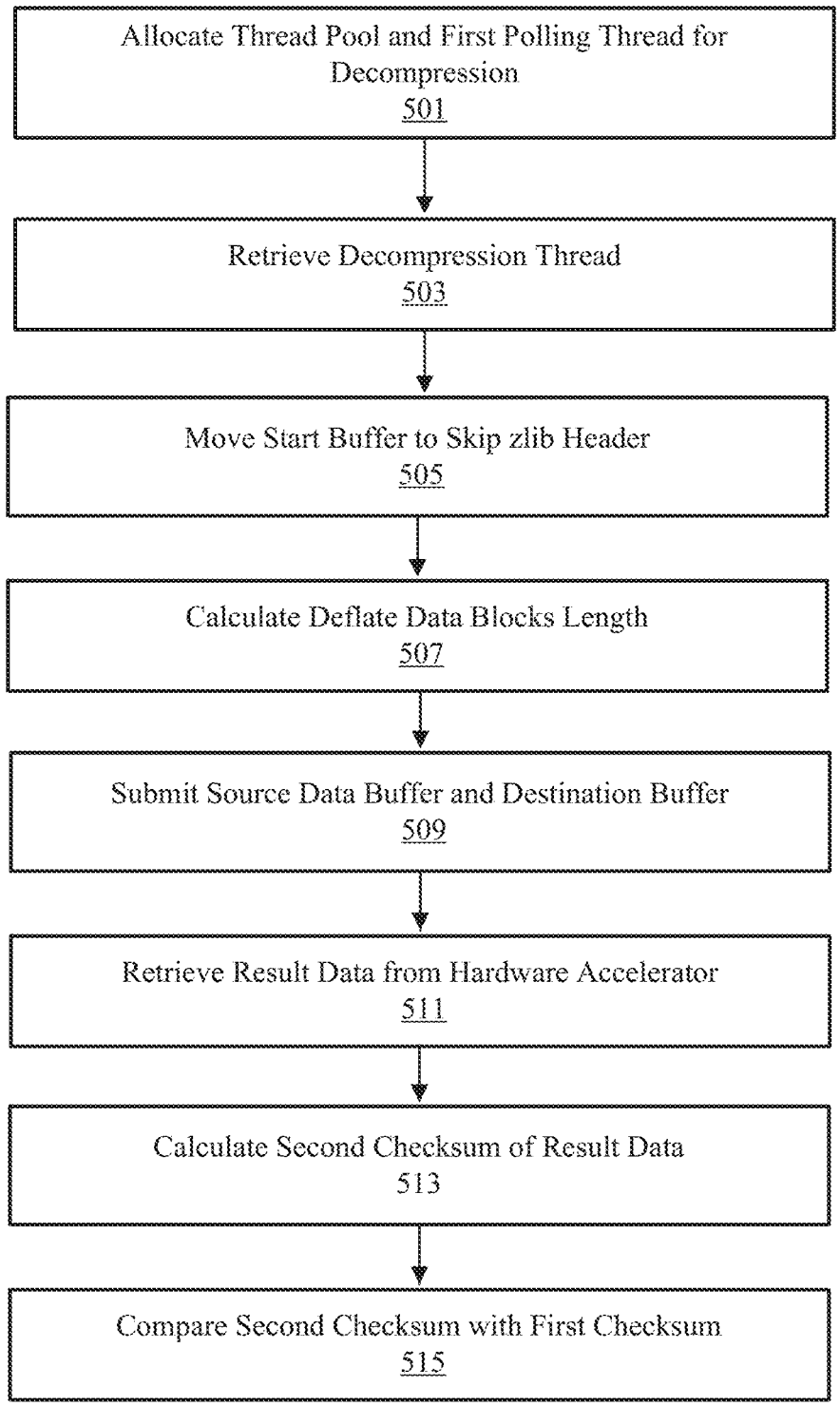
FIG. 5 is a flow diagram of an example data decompression process, according to an embodiment.

FIG. 5 is a flow diagram of an example data decompression process 500, according to an embodiment of the present disclosure. The data decompression process 500 can be executed, for example, by the data compression module 130 in FIG. 1.

In operation 501, the data compression module can allocate a thread pool for decompression jobs and a polling thread for polling the status of the hardware accelerator. In one embodiment, the hardware accelerator is a QAT-GZ hardware compressor, and the polling thread polls the complete status of the QAT-GZ compressor when the system initializes.

In operation 503, the data compression module retrieves a decompression thread from a thread pool in response to a decompression request from the file system. In one embodiment, the decompression thread handles the decompression request and source data buffer.

In operation 505, the decompression thread moves the start buffer point to skip the fixed zlib header. As discussed above, the zlib header can include a fixed number of bytes at the head of the result data.

In operation 507, the decompression thread calculates the length of the deflate data blocks.

In operation 509, the source data buffer is submitted to the hardware accelerator, and a destination buffer for getting the decompressed data results is also submitted. In one embodiment, the length of the destination buffer needs to be enough to take the decompressed data. In some embodiments, the polling thread periodically polls the completion registers of the hardware accelerator and wakes up the decompression thread.

In operation 511, the decompression thread retrieves the result data from the hardware accelerator.

In operation 513, a second checksum of the result data from the decompression is calculated and returned by the hardware accelerator.

In operation 515, this second checksum is compared against the first checksum, which is in the zlib footer of the source buffer. In one embodiment, if the checksums are the same, then the decompression is successful. Otherwise, an error report can be generated indicating that the decompression was unsuccessful.

Figure 6:
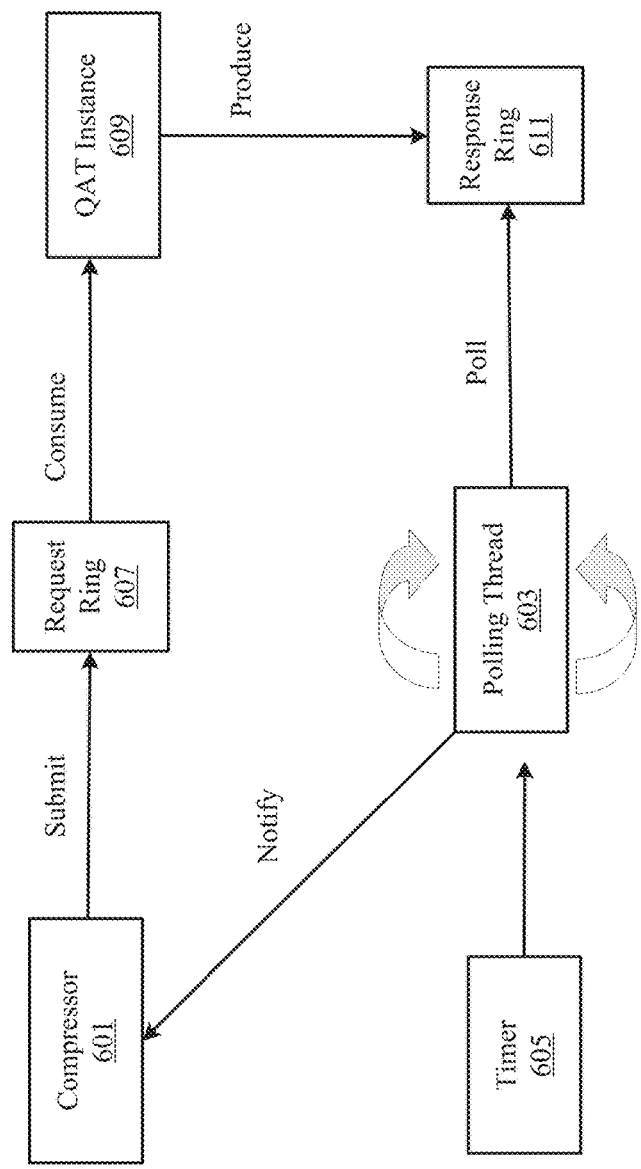
FIG. 6 is a block diagram illustrating the operation of a polling thread, according to an embodiment.

FIG. 6 is a block diagram illustrating the operation of a polling thread, according to an embodiment of the present disclosure. In one embodiment, compression or decompression threads pass input data to a request queue of a hardware accelerator and then wait for the hardware accelerator to do the compression and/or decompression work. When the device finishes its work, a structured message can be put in the response queue of the device. Multiple design options are possible for polling the compression status.

In one embodiment, a polling thread 603 is pre-allocated and polls all the QAT hardware instances 609. The polling thread 603 can be set to real time priority with a timer 605 so that it is able to run in a specified time interval, even when the system has a heavy workload. The polling thread 603 polls the response ring 611 periodically, and then notifies the compressor thread 601, which in turn can submit to the request ring 607. The mechanism used to wake up the compressor threads can impact the compression/decompression latency. Using one real-time polling thread to poll all QAT hardware instances periodically can increase efficiency such that the completed QAT instances are polled in one polling cycle.

In one embodiment, function cpaDcCompressData( ) and cpaDcDecompressData( ) are called in SYNC mode with null callback function. After sumitting data to a QAT device via these functions, the compressor thread falls to sleeping status. A real-time thread is created to poll and wake up the compression/decompression threads. It polls the ring buffer to fetch the result status for each QAT instance. If the result status of one instance is OK, it will wake up the corresponding compressor thread. The interval of the polling and wake up operation is 20 microseconds for better IO latency, in some embodiments. It may take additional time for the compression thread to get scheduled to run on the CPU. Table 1 below shows example test results for how long it would take to wake up and schedule a compression thread using a polling thread (wake up latency with real-time polling).

TABLE 1

| | Test Case | | | | | | | | |
|---|---|---|---|---|---|---|---|---|---|
| | Gen0 Write | Gen1 Write | Gen 15 Write | Gen25 Write | Gen39 Write | Gen42 Write | Gen43 Write | Gen1 Read | Gen42 Read |
| Latency | 111.057 | 109.379 | 108.169 | 108.765 | 109.745 | 110.626 | 110.317 | 117.744 | 122.480 |

According to an alternative embodiment, a polling thread can poll the completion status before the compression thread calls a QAT compression API for a specific QAT hardware instance. When the completion status is polled, the polling thread can wake up the compression thread and exit. In another embodiment, some polling threads can be pre-allocated for each QAT hardware instance, which continue polling the completion status and waking up the compression threads.

Figure 7:
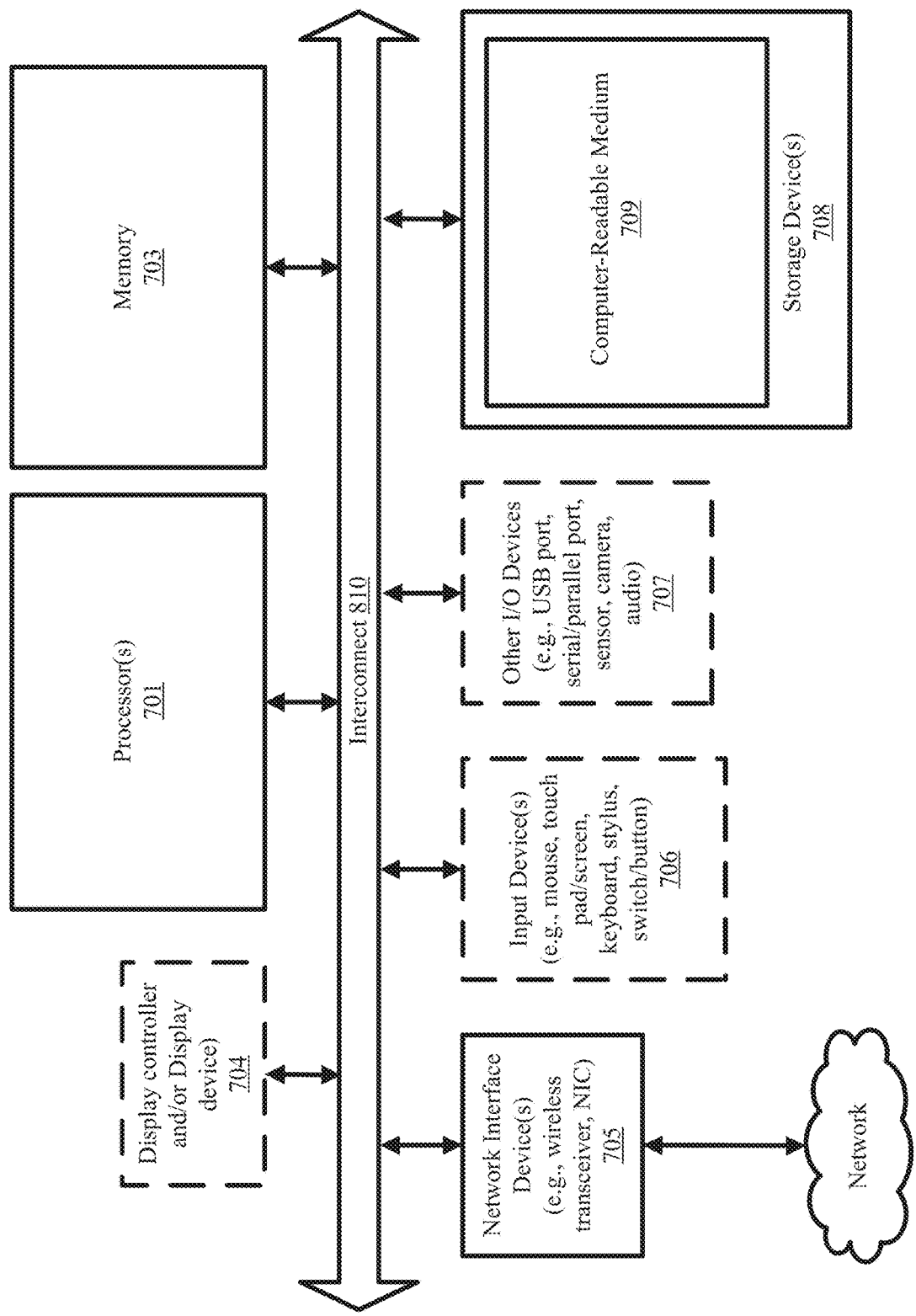
FIG. 7 is a block diagram illustrating an example of a data processing system that may be used with embodiments described herein.

FIG. 7 is a block diagram illustrating an example of a data processing system 700 that may be used with embodiments described herein. The data processing system 700 may represent any of the data processing systems described above and may perform any of the processes or methods described above. The data processing system 700 can include many different components. These components can be implemented as integrated circuits (ICs), discrete electronic devices, or other modules adapted to a circuit board such as a motherboard or add-in card of the computer system, or as components otherwise incorporated within a chassis of the computer system. Note also that the data processing system 700 is intended to show a high-level view of many components of the computer system. However, it is to be understood that additional components may be present in certain implementations and furthermore, different arrangement of the components shown may occur in other implementations. The data processing system 700 may represent a desktop, a laptop, a tablet, a server, a mobile phone, a media player, a personal digital assistant (PDA), a personal communicator, a gaming device, a network router or hub, a wireless access point (AP) or repeater, a set-top box, or a combination thereof. Further, while only a single machine or system is illustrated, the term "machine" or "system" shall also be taken to include any collection of machines or systems that individually or jointly execute a set (or multiple sets) of instructions to perform any one or more of the methodologies discussed herein.

In one embodiment the data processing system 700 includes one or more processor(s) 701, memory 703, network interface devices, 705, I/O devices, 706, 707 and storage device(s) 708 connected via a bus or an interconnect 710. The one or more processor(s) 701 may be a single processor or multiple processors with a single processor core or multiple processor cores included therein. The processor(s) 701 may represent one or more general-purpose processors such as a microprocessor, a central processing unit (CPU), or the like. More particularly, the processor(s) 701 may be a complex instruction set computing (CISC) microprocessor, reduced instruction set computing (RISC) microprocessor, very long instruction word (VLIW) microprocessor, or processor implementing other instruction sets, or processors implementing a combination of instruction sets. The processor(s) 701 may also be one or more special-purpose processors such as an application specific integrated circuit (ASIC), a cellular or baseband processor, a field programmable gate array (FPGA), a digital signal processor (DSP), a network processor, a graphics processor, a network processor, a communications processor, a cryptographic processor, a co-processor, an embedded processor, or any other type of logic capable of processing instructions.

The processor(s) 701 may be a low power multi-core processor, such as an ultra-low voltage processor, and may act as a main processing unit and central hub for communication with the various components of the system. Such processor can be implemented as a system on chip (SoC). The processor(s) 701 are configured to execute instructions for performing the operations and steps discussed herein. The data processing system 700 may further include a graphics/display subsystem 704, which may include a display controller, a graphics processor, and/or a display device. In one embodiment at least a portion of the graphics/display subsystem 704 is integrated into the processors(s) 701. The graphics/display subsystem 704 is optional and some embodiments may not include one or more components of the graphics/display subsystem 704.

The processor(s) 701 communicates with memory 703, which in one embodiment can be implemented via multiple memory devices to provide for a given amount of system memory. The memory 703 may include one or more volatile storage (or memory) devices such as random access memory (RAM), dynamic RAM (DRAM), synchronous DRAM (SDRAM), static RAM (SRAM), or other types of storage devices. The memory 703 may store information including sequences of instructions that are executed by the one or more processor(s) 701 or any other device. For example, executable code and/or data of a variety of operating systems, device drivers, firmware (e.g., input output basic system or BIOS), and/or applications can be loaded in the memory 703 and executed by one of the processor(s) 701. The operating system can be any kind of operating system such as, for example, Windows® operating system from Microsoft®, Mac OS®/iOS® from Apple, Android® from Google®, Linux®, Unix®, or other real-time or embedded operating systems such as VxWorks.

The data processing system 700 may further include I/O devices such as a network interface device(s) 705, input device(s) 706, and other I/O device(s) 707. Some of the input device(s) 706 and other I/O device(s) 707 may be optional and are excluded in some embodiments. The network interface device(s) 705 may include a wireless transceiver and/or a network interface card (NIC). The wireless transceiver may be a WiFi transceiver, an infrared transceiver, a Bluetooth transceiver, a WiMax transceiver, a wireless cellular telephony transceiver, a satellite transceiver (e.g., a global positioning system (GPS) transceiver), or other radio frequency (RF) transceivers, or a combination thereof. The NIC may be an Ethernet card.

The input device(s) 706 may include a mouse, a touch pad, a touch sensitive screen (which may be integrated with a display device of the graphics/display subsystem 704), a pointer device such as a stylus, and/or a keyboard (e.g., physical keyboard or a virtual keyboard displayed as part of a touch sensitive screen). For example, the input device(s) 706 may include a touch screen controller coupled to a touch screen. The touch screen and touch screen controller can, for example, detect contact and movement or a break thereof using any of a plurality of touch sensitivity technologies, including but not limited to capacitive, resistive, infrared, and surface acoustic wave technologies, as well as other proximity sensor arrays or other elements for determining one or more points of contact with the touch screen.

The other I/O device(s) 707 may also include an audio device. An audio device may include a speaker and/or a microphone to facilitate voice-enabled functions, such as voice recognition, voice replication, digital recording, and/or telephony functions. The other I/O device(s) 707 may also include universal serial bus (USB) port(s), parallel port(s), serial port(s), a printer, a network interface, a bus bridge (e.g., a PCI-PCI bridge), sensor(s) (e.g., a motion sensor such as an accelerometer, gyroscope, a magnetometer, a light sensor, compass, a proximity sensor, etc.), or a combination thereof. The other I/O device(s) 707 may further include an imaging processing subsystem (e.g., a camera), which may include an optical sensor, such as a charged coupled device (CCD) or a complementary metal-oxide semiconductor (CMOS) optical sensor, utilized to facilitate camera functions, such as recording photographs and video clips. Certain sensors may be coupled to interconnect 710 via a sensor hub (not shown), while other devices such as a keyboard or thermal sensor may be controlled by an embedded controller (not shown), dependent upon the specific configuration or design of data processing system 700.

To provide for persistent storage of information such as data, applications, one or more operating systems and so forth, a mass storage (not shown) may also couple to the processor(s) 801. In various embodiments, to enable a thinner and lighter system design as well as to improve system responsiveness, this mass storage may be implemented via a solid state device (SSD). However in other embodiments, the mass storage may primarily be implemented using a hard disk drive (HDD) with a smaller amount of flash based storage to act as an SSD cache to enable non-volatile storage of context state and other such information during power down events so that a fast power up can occur on re-initiation of system activities. In addition, a flash device may be coupled to the processor(s) 801, e.g., via a serial peripheral interface (SPI). This flash device may provide for non-volatile storage of system software, including a basic input/output software (BIOS) as well as other firmware of the system.

The storage device(s) 708 may include computer-readable storage medium 709 (also known as a machine-readable storage medium) on which is stored one or more sets of instructions or software embodying any one or more of the methodologies or functions described herein. The computer-readable storage medium 709 may also be used to store the same software functionalities described above persistently. While the computer-readable storage medium 709 is shown in an exemplary embodiment to be a single medium, the term "computer-readable storage medium" should be taken to include a single medium or multiple media (e.g., a centralized or distributed database, and/or associated caches and servers) that store the one or more sets of instructions. The terms "computer-readable storage medium" shall also be taken to include any medium that is capable of storing or encoding a set of instructions for execution by the machine and that cause the machine to perform any one or more of the methodologies of the present invention. The term "computer-readable storage medium" shall accordingly be taken to include, but not be limited to, solid-state memories, and optical and magnetic media, or any other non-transitory machine-readable medium.

Note that while the data processing system 700 is illustrated with various components of a data processing system, it is not intended to represent any particular architecture or manner of interconnecting the components; as such, details are not germane to embodiments of the present invention. It will also be appreciated that network computers, handheld computers, mobile phones, servers, and/or other data processing systems, which have fewer components or perhaps more components, may also be used with embodiments of the invention.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as those set forth in the claims below, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of the invention also relate to an apparatus for performing the operations herein. Such a computer program is stored in a non-transitory computer readable medium. A machine-readable medium includes any mechanism for storing information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices).

The processes or methods depicted in the preceding figures may be performed by processing logic that comprises hardware (e.g. circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially. Embodiments described herein are not described with reference to any particular programming language. It will be appreciated that a variety of programming languages may be used to implement the teachings of embodiments of the invention as described herein.

The following clauses and/or examples pertain to specific embodiments or examples thereof. Specifics in the examples may be used anywhere in one or more embodiments. The various features of the different embodiments or examples may be variously combined with some features included and others excluded to suit a variety of different applications. Examples may include subject matter such as a method, means for performing acts of the method, at least one machine-readable medium including instructions that, when performed by a machine cause the machine to performs acts of the method, or of an apparatus or system according to embodiments and examples described herein. Various components can be a means for performing the operations or functions described.

One embodiment provides for a computer implemented method of data compression using a hardware accelerator, the method comprising: allocating a first thread pool for compression jobs and a first polling thread for polling the status of a hardware accelerator; retrieving a compression thread from the first thread pool in response to a compression request from a file system; aggregating multiple source data buffers from the file system into a compression unit; submitting a scatter gather list and a destination buffer to the hardware accelerator; calculating a first checksum of result data from the destination buffer; adding a zlib header to the result data; and adding the first checksum as a zlib footer to the result data.

One embodiment provides for a data compression system including one or more processing devices; a hardware accelerator for compressing and decompressing data; and data compression logic to compress data via the one or more processing devices, the data compression logic configured to: allocate a first thread pool for compression jobs and a first polling thread for polling the status of the hardware accelerator; retrieve a compression thread from the first thread pool in response to a compression request from a file system; aggregate multiple source data buffers from the file system into a compression unit; submit a scatter gather list and a destination buffer to the hardware accelerator; calculate a first checksum of result data from the destination buffer; add a zlib header to the result data; and add the first checksum as a zlib footer to the result data.

One embodiment provides for a non-transitory computer-readable medium storing instructions which, when executed by one or more processors, cause the one or more processors to perform a data compression operation, the operation comprising: allocating a first thread pool for compression jobs and a first polling thread for polling the status of a hardware accelerator; retrieving a compression thread from the first thread pool in response to a compression request from a file system; aggregating multiple source data buffers from the file system into a compression unit; submitting a scatter gather list and a destination buffer to the hardware accelerator; calculating a first checksum of result data from the destination buffer; adding a zlib header to the result data; and adding the first checksum as a zlib footer to the result data.

In the foregoing specification, the invention has been described with reference to specific embodiments thereof. However, various modifications and changes can be made thereto without departing from the broader spirit and scope of the invention. The specification and drawings are, accordingly, to be regarded in an illustrative rather than a restrictive sense.

What is claimed is:

1. A computer implemented method of data compression, the method comprising:
segmenting user data into data segments;
deduplicating, by a first processor, the data segments to form deduped data segments;
aggregating, by the first processor, the deduped data segments into a compression unit, wherein the deduped data segments are linked into a scatter gather list;
responsive to a size of the compression unit exceeding a defined threshold, transmitting the scatter gather list to a hardware accelerator, different from the first processor;
compressing the deduped data segments of the compression unit by the hardware accelerator using the scatter gather list;
packing the compression unit into a compression region; and
packing the compression region into one or more containers.

2. The computer implemented method as in claim 1, wherein the hardware accelerator is a QuickAssist Technology accelerator.

3. The computer implemented method as in claim 1, wherein the compression region is stored in a non-volatile memory.

4. The computer implemented method as in claim 3, further comprising:
transmitting a notification to a file system indicating that the compression has been completed.

5. The computer implemented method as in claim 1, the method further comprising:
reading locally compressed data into a file system;
decompressing the locally compressed data to recover data segments and reconstruct a file;
performing deduplication on the file by sending fingerprints to a cloud to form deduped data;
compressing the deduped data using a hardware accelerator to form compressed data; and
sending the compressed data to the cloud.

6. The computer implemented method as in claim 5, wherein the hardware accelerator is a QuickAssist Technology accelerator.

7. The computer implemented method as in claim 5, wherein the compressed data includes content data and metadata.

8. The computer implemented method as in claim 1, wherein compressing the deduped data segments of the compression unit comprises utilizing a GZ compression algorithm.

9. The computer implemented method as in claim 1, further comprising:
transmitting a destination buffer to the hardware accelerator along with the scatter gather list;
after the compressing the deduped data segments by the hardware accelerator, calculating, by the first processor, a first checksum of result data from the destination buffer;
adding a header to the result data; and
adding the first checksum as a footer to the result data.

10. A data compression system comprising:
one or more processing devices;
a hardware accelerator, different from the one or more processing devices, for compressing and decompressing data; and
data compression logic to compress data via the one or more processing devices, the data compression logic configured to:
segment user data into data segments;
deduplicate, by the one or more processing devices, the data segments to form deduped data segments;
aggregate, by the one or more processing devices, the deduped data segments into a compression unit, wherein the deduped data segments are linked into a scatter gather list;
responsive to a size of the compression unit exceeding a defined threshold, transmit the scatter gather list to the hardware accelerator;
compress the deduped data segments of the compression unit the hardware accelerator using the scatter gather list;
pack the compression unit into a compression region; and
pack the compression region into one or more containers.

11. The data compression system as in claim 10, wherein the hardware accelerator is a QuickAssist Technology accelerator.

12. The data compression system as in claim 10, wherein the compression region is stored in a non-volatile memory.

13. The data compression system as in claim 12, wherein the data compression logic is further configured to:
transmit a notification to a file system indicating that the compression has been completed.

14. The data compression system as in claim 10, wherein the data compression logic is further configured to:
read locally compressed data into a file system;
decompress the locally compressed data to recover data segments and reconstruct a file;
perform deduplication on the file by sending fingerprints to a cloud to form deduped data;
compress the deduped data using a hardware accelerator to form compressed data; and
send the compressed data to the cloud.

15. A non-transitory computer-readable medium storing instructions which, when executed by one or more processors, cause the one or more processors to perform a data compression operation, the data compression operation comprising:
segmenting user data into data segments;
deduplicating, by the one or more processors, the data segments to form deduped data segments;
aggregating, by the one or more processors, the deduped data segments into a compression unit, wherein the deduped data segments are linked into a scatter gather list;
responsive to a size of the compression unit exceeding a defined threshold, transmitting the scatter gather list to a hardware accelerator, different from the one or more processors;
compressing the deduped data segments of the compression unit by the hardware accelerator using the scatter gather list;
packing the compression unit into a compression region; and
packing the compression region into one or more containers.

16. The non-transitory computer-readable medium as in claim 15, wherein the hardware accelerator is a QuickAssist Technology accelerator.

17. The non-transitory computer-readable medium as in claim 15, wherein the compression region are stored in a non-volatile memory.

18. The non-transitory computer-readable medium as in claim 17, the data compression operation further comprising:
   transmitting a notification to a file system indicating that the compression has been completed.

19. The non-transitory computer-readable medium of claim 15, the data compression operation further comprising:
   reading locally compressed data into a file system;
   decompressing the locally compressed data to recover data segments and reconstruct a file;
   performing deduplication on the file by sending fingerprints to a cloud to form deduped data;
   compressing the deduped data using a hardware accelerator to form compressed data; and
   sending the compressed data to the cloud.

20. The non-transitory computer-readable medium as in claim 19, wherein the compressed data includes content data and metadata.

\* \* \* \* \*